(12) United States Patent
Bellman et al.

(10) Patent No.: US 10,957,628 B2
(45) Date of Patent: Mar. 23, 2021

(54) BOTTOM UP ELECTROPLATING WITH RELEASE LAYER

(71) Applicant: Corning Incorporated, Corning, NY (US)

(72) Inventors: Robert Alan Bellman, Ithaca, NY (US); Rajesh Vaddi, Corning, NY (US)

(73) Assignee: Corning Incorporated, Corning, NY (US)

( * ) Notice: Subject to any disclaimer, the term of this patent is extended or adjusted under 35 U.S.C. 154(b) by 1 day.

(21) Appl. No.: 16/592,065

(22) Filed: Oct. 3, 2019

(65) Prior Publication Data

US 2020/0111726 A1 Apr. 9, 2020

Related U.S. Application Data

(60) Provisional application No. 62/742,998, filed on Oct. 9, 2018.

(51) Int. Cl.
*H01L 23/48* (2006.01)
*H01L 23/485* (2006.01)

(52) U.S. Cl.
CPC .......... *H01L 23/481* (2013.01); *H01L 23/485* (2013.01); *H01L 2224/05139* (2013.01); *H01L 2224/05147* (2013.01); *H01L 2224/05155* (2013.01); *H01L 2224/05184* (2013.01); *H01L 2224/05187* (2013.01); *H01L 2224/05447* (2013.01)

(58) Field of Classification Search
CPC ................. H01L 23/481; H01L 23/485; H01L 2224/05147; H01L 2224/05447; H01L 2224/05155; H01L 2224/05184; H01L 2224/05187
USPC .................. 438/629, 637, 678; 257/774, 771
See application file for complete search history.

(56) References Cited

U.S. PATENT DOCUMENTS

2017/0156209 A1* 6/2017 Wang et al. ........... H05K 1/116

* cited by examiner

*Primary Examiner* — Thinh T Nguyen
(74) *Attorney, Agent, or Firm* — Amy T. Lang; John P. McGroarty

(57) ABSTRACT

A method for producing a conductive through-via, including applying a seed layer on a surface of a first substrate, and forming a surface modification layer on at least one of the seed layer and a second substrate. Next, the second substrate is bonded to the first substrate with the surface modification layer to form an assembly. A conductive release layer is formed in the at least one through-via by placing a conductive release material into the at least one through-via. The conductive release layer is present on the seed layer and in the at least one through-via. A conductive metal material is applied to the at least one through-via, and the second substrate is removed from the assembly after applying the conductive metal material to the at least one through via.

20 Claims, 3 Drawing Sheets

BOTTOM UP ELECTROPLATING WITH RELEASE LAYER

This application claims the benefit of priority to U.S. Provisional Application Ser. No. 62/742,998 filed on Oct. 9, 2018, the content of which is relied upon and incorporated herein by reference in its entirety.

BACKGROUND

Field

The present specification generally relates to methods for manufacturing glass and glass ceramic substrates with conductive through vias by bottom up electroplating with a release layer.

Technical Background

Glass and glass ceramic substrates are used in components of electronic devices because the glass and glass ceramic substrates, generally, do not react with other components of the electronic devices, because they are they have a low dielectric constant, and because they are thermally stable. In many electronic devices, the glass or glass ceramic substrates have through-vias that can be rendered conductive by introducing metal into the through-vias, such as, for example, interposers. To use glass or glass ceramic as a substrate for components of electronic devices, such as, for example, interposers, a conductive metal layer is applied to one or more surfaces of the glass or glass ceramic substrate and fill the through-vias in the glass or glass ceramic substrate. However, conductive metals do not bond well with glass or glass ceramics and the conductive metal layer can separate from the through-vias in the glass or glass ceramic substrate.

Accordingly, a need exists for a method to increase the likelihood that a metal conductive layer will remain in the through-vias of a glass or glass ceramic substrate.

SUMMARY

According to a first clause, a method for producing a conductive through-via, comprises: applying a seed layer on a surface of a first substrate; forming a surface modification layer on at least one of the seed layer and a second substrate, wherein the second substrate comprises a first surface, a second surface, and at least one through-via extending from the first surface to the second surface; bonding the second substrate to the first substrate with the surface modification layer formed on at least one of the seed layer and the second substrate to form an assembly, wherein the seed layer and the surface modification layer are disposed between the first substrate and the second substrate; forming a conductive release layer in the at least one through-via by placing a conductive release material into the at least one through-via, wherein the conductive release layer is present on the seed layer and in the at least one through-via; applying a conductive metal material to the at least one through-via; and removing the second substrate from the assembly after applying the conductive metal material to the at least one through via.

A second clause comprises the method of the first clause, wherein the conductive release layer has an adhesion of less than 1.0 N/cm.

A third clause comprises the method of the any one of the first and second clauses, wherein the conductive release layer is a continuous layer.

A fourth clause comprises the method of any one of the first to third clauses, wherein the conductive release layer does not flake.

A fifth clause comprises the method of any one of the first to fourth clauses, wherein the conductive release layer has a thickness from greater than or equal to 50 nm to less than or equal to 500 nm.

A sixth clause comprises the method of any one of the first to fifth clauses, wherein the conductive release layer has a sheet resistance from greater than or equal to 0.001 ohm/square to less than or equal to 20.000 ohm/square.

A seventh clause comprises the method of any one of the first to sixth clauses, wherein the conductive release layer has a porosity from greater than or equal to 1.0 nm to less than or equal to 20.0 nm.

An eighth clause comprises the method of any one of the first to seventh clauses, wherein the conductive release material self catalyzes with the seed layer.

A ninth clause comprises the method of any one of the first to eighth clauses, wherein the conductive release material is an electroless metal material that is compatible with plating.

A tenth clause comprises the method of any one of the first to ninth clauses, wherein the conductive release material is selected from the group consisting of electroless nickel, electroless copper, and electroless silver.

An eleventh clause comprises the method of any one of the first to tenth clauses, wherein the conductive release material is electroless copper.

A twelfth clause comprises the method of any one of the first to eleventh clauses, wherein the at least one through-via has a diameter from greater than or equal to 5 µm to less than or equal to 100 µm.

A thirteenth clause comprises the method of any one of the first to twelfth clauses, wherein the seed layer is a conductive metal material selected from the group consisting of copper, silver, tungsten, titanium nitride, titanium tungsten, tantalum nitride, and copper alloys.

A fourteenth clause comprises the method of any one of the first to thirteenth clauses, wherein the second substrate is glass or glass ceramic.

A fifteenth clause comprises the method of any one of the first to fourteenth clauses, wherein the first substrate is glass or glass ceramic.

A sixteenth clause comprises the method of any one of the first to fifteenth clauses, wherein applying the conductive metal material to the at least one through-via comprises electrolytically plating the at least one through-via.

A seventeenth clause comprises the method of any one of the first to sixteenth clauses, wherein the at least one through-via is filled with the conductive metal material.

An eighteenth clause comprises the method of any one of the first to seventeenth clauses, wherein the conductive metal material is a metal.

A nineteenth clause comprises the method of any one of the first to eighteenth clauses, wherein the conductive metal material is copper.

A twentieth clause comprises the method of any one of the first to nineteenth clauses, wherein removing the second substrate from the assembly does not result in conductive metal material being left on the first substrate.

Additional features and advantages will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

DETAILED DESCRIPTION

Figure 1A:
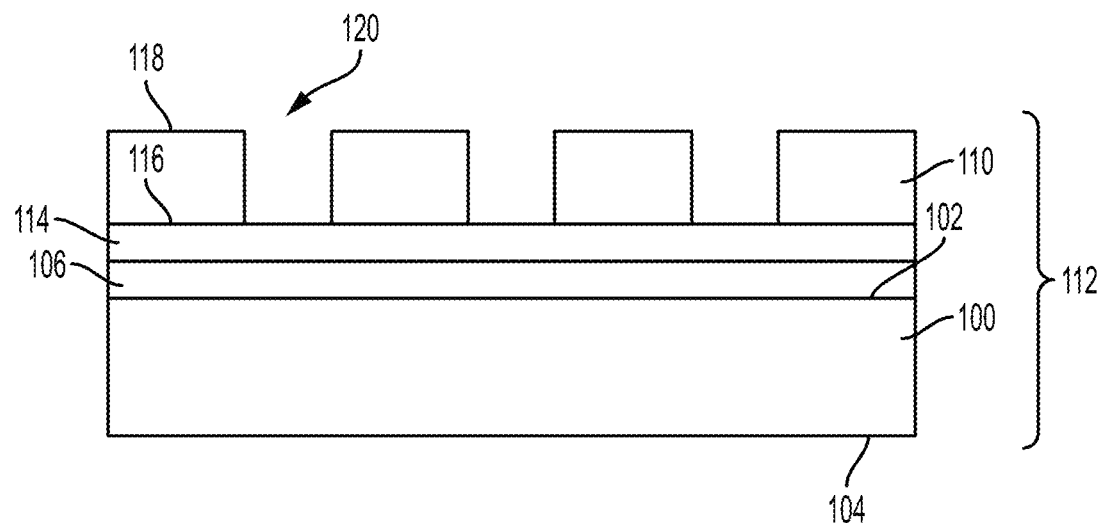
FIGS. 1A-1E schematically depict cross sections of assemblies according to embodiments disclosed and described herein.

All interposers have a need for electrical conduction through the thickness of the substrate. This is accomplished using an electrically conductive via typically constructed by fabricating a through-via in the substrate by computer numerical controller (CNC) drilling and then coating and/or filling the through-via with electrically conductive metal material such as, for example, copper. In the case of solid filled electrically conducting vias a uniform electrically conducting layer is applied and then electrolytic/galvanic plating is completed until the through-via is filled. In this process a few issues are encountered. First, a uniform layer of conducting material is plated on all surfaces, including the planar layers perpendicular to the walls of the through-via. This results in a thick layer equal to approximately half of the diameter of the hole. Thus, in the case of a 30 μm diameter hole a 15 μm thick layer of electrically conductive metal material, such as, for example, copper would result on each side. This thick layer of electrically conductive metal material is known as "overburden" and in some cases is not desired. Second, it is very difficult to plate holes that have a ratio of thickness to hole diameter (aspect ratio) of greater than 3:1, which may be desired in some embodiments.

Additionally, during the electrolytic/galvanic plating process, a first substrate that is not the interposer may be used to support the interposer substrate. In this instance, a seed layer that aids in the electrolytic/galvanic plating process is present between the first substrate and the interposer substrate. After electrolytic/galvanic plating, the interposer substrate is removed from the first substrate, preferably with its through-vias filled with electrically conductive metal material. During the electrolytic/galvanic plating process, the electrically conductive metal material—that is filling the through-vias formed in the interposer substrate—bonds with a seed layer formed on the first substrate. On occasion, this bond between the electrically conductive metal material and the seed layer is stronger than a bond between the electrically conductive metal material and the interposer substrate. In this situation, the electrically conductive metal material will remain on the seed layer—which remains on the first substrate—when the interposer substrate is removed from the first substrate. This results in through-vias of the interposer that were intended to be filled with electrically conductive metal material to not be filled with electrically conductive metal material. Further, in some instances, when the electrically conductive metal material remains on the seed layer—and thus the first substrate—when the interposer substrate is removed, the interposer substrate may be damaged upon removal.

Reference will now be made in detail to embodiments of methods for bottom up electroplating with release layers, embodiments of which are illustrated in the accompanying drawings. Whenever possible, the same reference numerals will be used throughout the drawings to refer to the same or like parts. In one embodiment, A method for producing a conductive through-via, comprises: applying a seed layer on a surface of a first substrate; forming a surface modification layer on at least one of the seed layer and a second substrate, wherein the second substrate comprises a first surface, a second surface, and at least one through-via extending from the first surface to the second surface; bonding the second substrate to the first substrate with the surface modification layer formed on at least one of the seed layer and the second substrate to form an assembly, wherein the seed layer and the surface modification layer are disposed between the first substrate and the second substrate; forming a conductive release layer in the at least one through-via by placing a conductive release material into the at least one through-via, wherein the conductive release layer is present on the seed layer and in the at least one through-via; applying a conductive metal material to the at least one through-via; and removing the second substrate from the assembly after applying the conductive metal material to the at least one through-via.

FIGS. 1A-1E schematically illustrate an exemplary process for applying electrically conductive metal material in a through-via. FIG. 1A schematically illustrates initial steps of some embodiments where a first substrate 100 having a first surface 102 and an opposing second surface 104 has a seed layer 106 applied to the first surface 102. In some embodiments, the first substrate 100 is a carrier substrate for supporting a second substrate while the second substrate is processed. In some embodiments, the first substrate 100 can be a material capable of providing support to a second substrate to prevent flexing or bending of the second substrate during processing, and thereby preventing damage, for example breakage or cracking, to the second substrate 110. In some embodiments, the material for the first substrate 100 can include, but is not limited to, glass, metal, a polymer, ceramic, glass ceramic, or sapphire. In some embodiments, the first substrate 100 can have a thickness in a range from greater than or equal to 0.2 mm to less than or equal to 3.0 mm, such as greater than or equal to 0.2 mm, greater than or equal to 0.3 mm, greater than or equal to 0.4 mm, greater than or equal to 0.5 mm, greater than or equal to 0.6 mm, greater than or equal to 0.7 mm, greater than or equal to 0.8 mm, greater than or equal to 0.9 mm, greater than or equal to 1.0 mm, greater than or equal to 1.5 mm, greater than or equal to 2.0 mm, greater than or equal to 2.5 mm, or greater than or equal to 3.0 mm. In some embodiments, the first substrate 100 can be made of one layer, as shown, or multiple layers bonded together. In some embodiments, the first surface 102 of the first substrate 100 can have an area in a range from about 500 mm$^2$ to about 9 m$^2$.

Seed layer 106 is, in some embodiments, an electrically conductive layer, which is relied on as a site for depositing the electrically conductive metal material that fills one or more through-vias 120 during an electrolytic plating process as describe below. In some embodiments, seed layer 106 comprises copper, silver, tungsten, titanium nitride, tantalum nitride, titanium tungsten, or copper alloys, such as, for example, copper-tin alloy. In some embodiments, the seed layer material is chosen to impede the growth of grains. In some embodiments, seed layer 106 is applied using known techniques, such as, for example, sputtering. In some embodiments, seed layer 106 can have a thickness in a range from greater than or equal to 50 nm to less than or equal to 2,000 nm measured by profilometer or scanning electron microscopy (SEM) cross section. In some embodiments, an initial seed layer having a thickness of in a range from greater than or equal to 100 nm to less than or equal to 1,000 nm, for example, can be formed by sputtering and then an additional deposition technique, such as, for example, electrolytic plating or electroless plating, can be used to achieve a seed layer of a final desired thickness.

Next, a second substrate 110 is bonded to the first substrate 100 to form an assembly 112. In some embodiments, a surface modification layer 114 is formed on at least one of the seed layer 106 and the second substrate 110 and the surface modification layer 114 forms the bond between first substrate 100 and the second substrate 110. Thus, assembly 112 can include the following sequential layers: the first substrate 100, seed layer 106, surface modification layer 114, and second substrate 110. The second substrate 110 can have a first surface 116, an opposing second surface 118, and one or more through-vias 120 extending from first surface 116 to second surface 118. In some embodiments, the second substrate 110 can be an interposer. In some embodiments, the second substrate 110 can be a material suitable for use an interposer, such as, for example, ceramic, glass ceramic, sapphire, quartz, silicon, or polymers. When the second substrate 110 is a polymer, the polymer can include polyimide, polyether ether ketone (PEEK), or polyvinyl difluoride (PVDF). In some embodiments, second substrate 110 can have a thickness in a range from greater than or equal to 20 µm to less than or equal to 3 mm, such as from greater than or equal to 20 µm to less than or equal to 1 mm, from greater than or equal to 20 µm to less than or equal to 300 µm, from greater than or equal to 20 µm to less than or equal to 200 µm, from greater than or equal to 40 µm to less than or equal to 300 µm, or from greater than or equal to 40 µm to less than or equal to 200 µm. In some embodiments, the second substrate 110 can have a thickness of less than or equal to about 300 µm measured with a Keyance laser thickness gauge. In some embodiments, the second substrate 110 can be made of one layer, as shown, or multiple layers bonded together. In some embodiments, the first surface 116 and/or the second surface 118 of the second substrate 110 can have an area in a range from about 500 mm² to about 9 m².

In some embodiments, the through-vias 120 present in the second substrate 110 have diameters ranging from greater than or equal to 5 µm to less than or equal to 100 µm, such as from greater than or equal to 10 µm to less than or equal to 100 µm, from greater than or equal to 20 µm to less than or equal to 100 µm, from greater than or equal to 30 µm to less than or equal to 100 µm, from greater than or equal to 40 µm to less than or equal to 100 µm, from greater than or equal to 50 µm to less than or equal to 100 µm, from greater than or equal to 60 µm to less than or equal to 100 µm, from greater than or equal to 70 µm to less than or equal to 100 µm, from greater than or equal to 80 µm to less than or equal to 100 µm, or from greater than or equal to 90 µm to less than or equal to 100 µm. In some embodiments, the through-vias 120 present in the second substrate 110 have diameters ranging from greater than or equal to 5 µm to less than or equal to 90 µm, from greater than or equal to 5 µm to less than or equal to 80 µm, from greater than or equal to 5 µm to less than or equal to 70 µm, from greater than or equal to 5 µm to less than or equal to 60 µm, from greater than or equal to 5 µm to less than or equal to 50 µm, from greater than or equal to 5 µm to less than or equal to 40 µm, from greater than or equal to 5 µm to less than or equal to 30 µm, from greater than or equal to 5 µm to less than or equal to 20 µm, or from greater than or equal to 5 µm to less than or equal to 100 µm. In some embodiments, the through-vias 120 present in the second substrate 110 have diameters ranging from greater than or equal to 10 µm to less than or equal to 90 µm, from greater than or equal to 20 µm to less than or equal to 80 µm, from greater than or equal to 30 µm to less than or equal to 70 µm, or from greater than or equal to 40 µm to less than or equal to 60 µm. The diameter of the through-vias is measured by high resolution optical microscope.

In some embodiments, the surface modification layer 114 provides a temporary bond between the first substrate 100 and the second substrate 110. In some embodiments, the surface modification layer 114 chemically modifies and/or reduces the surface energy of the second substrate 110 such that strong covalent or electrostatic bonds between the second substrate 110 and the seed layer 106 are limited. In some embodiments, the first substrate 100 can be a carrier substrate that supports second substrate 110 while second substrate 110 is processed, for example during filling of through-vias 120. The temporary bond provided by surface modification layer 114 can be controlled such that the bond withstands the processing conditions (for example, temperature, pressure, etc.) to which assembly 112 is subjected to during processing of the second substrate 110, but so that the bond can be broken after processing without damaging the first substrate 100 and/or the second substrate 110. For example, in some embodiments, forming of the surface modification layer 114 can be controlled to ensure an adhesion energy between the first substrate 100 and the second substrate 110 is in a range from greater than or equal to 50 mJ/m² to less than or equal to 2,000 mJ/m², from greater than or equal to 50 mJ/m² to less than or equal to 1,000 mJ/m², or from greater than or equal to 100 mJ/m² to less than or equal to 2,000 mJ/m². The adhesion energy is measured according to ASTM D3359 tape test.

In some embodiments, surface modification processes can include, but are not limited to: (1) plasma deposition of plasma-polymerized polymer films (for example, fluoropolymer films) on a surface as described in U.S. Pub. No. 2015/0120498, which is hereby incorporated by reference in its entirety; (2) deposition of a carbonaceous surface modification layer on a surface followed by incorporating polar groups with the carbonaceous surface modification layer as described in WIPO Pub. No. WO 2015/112958, which is hereby incorporated by reference in its entirety; or (3) treating a surface with a plasma selected from a fluoropolymer, the reaction products of a fluorinated etching agent, or a combination thereof as described in WIPO Pub. No. WO 2015/157202, which is hereby incorporated by reference in its entirety. Other suitable surface modification layers can include, but are not limited to, organosilicates, such as, for example, organosilicates containing trimethyl groups; fluorosilanes; organosilicons; organogermaniums; fluoropolymers, including plasma fluoropolymers formed by plasma reaction of an etch gas, for example, $CF_4$ with a polymer former such as, for example, $H_2$, $CHF_3$, $C_4F_8$, or $CH_4$; organic plasma polymers, for example those formed from a hydrocarbon, for example, $CH_4$, aliphatic hydrocarbons (for example alkanes, alkenes, or alkynes that have less than 8 carbons), benzene or aromatic hydrocarbons with less than 12 carbons. In some embodiments, the surface modification layer 114 may have an elastic modulus of less than or equal to 20 GPa, less than or equal to 15 GPa, less than or equal to 10 GPa, less than or equal to 5 GPa, or less than or equal to 1 GPa, as measured by a diamond Berkovitch indenter test. As used herein, the "Berkovitch indenter test" includes a test to measure hardness on a surface by indenting the surface with a Berkovitch indenter to form an indent having an indentation depth of at least about 100 nm from the surface. Although in the embodiment depicted in FIG. 1A the surface modification layer 114 is shown as a solid layer between the seed layer 106 and the second substrate 110, in some embodiments the surface modification layer 114 can cover 100% or less than 100%, of an interface between the seed layer 106 and the second substrate 110. In some embodiments, the surface modification layer 114 covers from greater than or equal to 1% to less than or equal to 100%, from greater than or equal to 10% to less than or equal to 100%, from greater than or equal to 20% to less than or equal to 90%, or from greater than or equal to 50% to less than or equal to 90% of an interface between the seed layer 106 and the second substrate 110. In some embodiments, the surface modification layer 114 can have a thickness in a range from greater than or equal to 0.1 nm to less than or equal to 100.0 nm, from greater than or equal to 0.1 nm to less than or equal to 10.0 nm, from greater than or equal to 0.1 nm to less than or equal to 2.0 nm, from greater than or equal to 0.1 nm to less than or equal to 1.0 nm, from greater than or equal to 0.1 nm to less than or equal to 0.5 nm, or from greater than or equal to 0.1 nm to less than or equal to 0.2 nm.

Figure 1B:
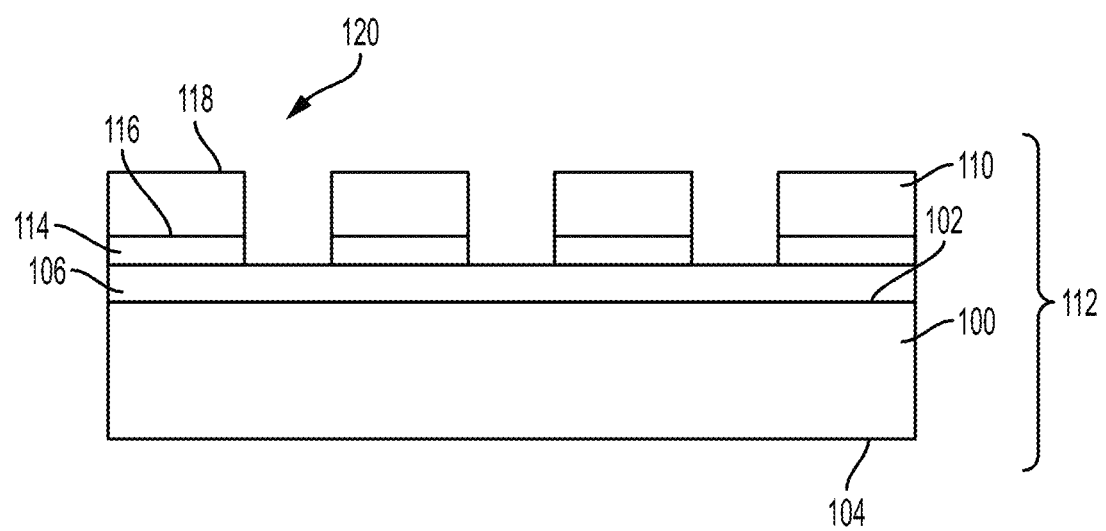

With reference now to FIG. 1B, in embodiments where the surface modification layer 114 is applied to the seed layer 106 (as opposed to embodiments where the surface modification layer 114 is only applied to the first surface 116 of the second substrate 110), a portion of surface modification layer 114 can be removed to expose seed layer 106. As shown in FIG. 1B, surface modification layer 114 can be removed such that through-vias 120 extend through surface modification layer 114. Surface modification layer 114 can be removed in instances where the material for surface modification layer 114 is not thin and/or conductive enough for seed layer 106 to work effectively in applying conductive metal material as discussed below. In some embodiments, surface modification layer 114 can be removed with an oxidizing reagent, for example an oxygen plasma, or any other suitable method that will decompose the surface modification layer 114. Exemplary oxygen plasmas can include, but are not limited to fluorine containing oxygen plasma such as $CF_4$—$O_2$ or $SF_6$—$O_2$.

Figure 1C:
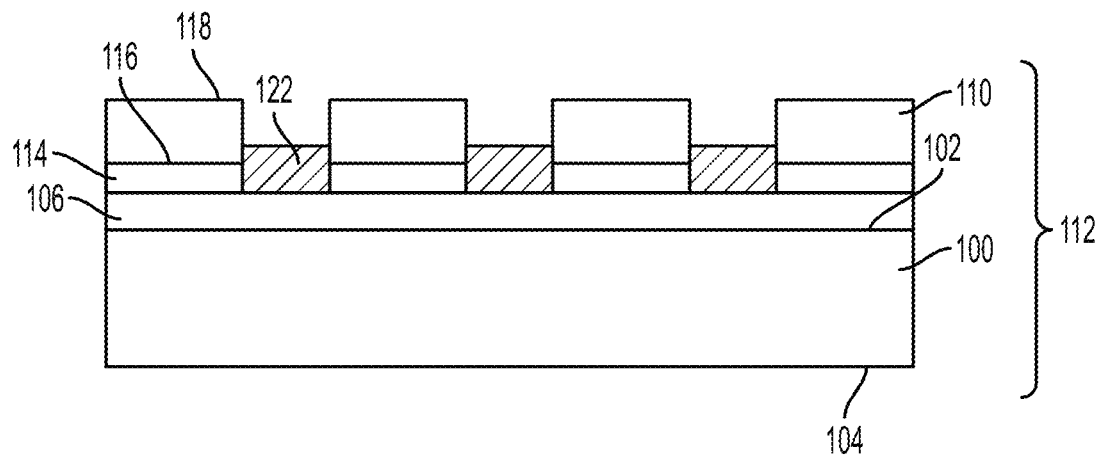

With reference now to FIG. 1C, in embodiments, a conductive release layer 122 is formed in the through-vias 120 by placing a conductive release material into the through-vias 120 such that the conductive release layer 122 is present on the seed layer 106. In embodiments, the conductive release layer 122 is formed such that it has an adhesion energy of less than $1.0 \times 10^5$ mJ/m$^2$, such as less than or equal to $0.9 \times 10^5$ mJ/m$^2$, less than or equal to $0.8 \times 10^5$ mJ/m$^2$, less than or equal to $0.7 \times 10^5$ mJ/m$^2$, less than or equal to $0.6 \times 10^5$ mJ/m$^2$, less than or equal to $0.5 \times 10^5$ mJ/m$^2$, less than or equal to $0.4 \times 10^5$ mJ/m$^2$, less than or equal to $0.3 \times 10^5$ mJ/m$^2$, less than or equal to $0. \times 10^5$ mJ/m$^2$, or, less than or equal to $0.1 \times 10^5$ mJ/m$^2$. The adhesion energy is measured according to ASTM D3359 tape test.

In some embodiments, the conductive release layer 122 has a thickness that is large enough that the conductive release layer 122 is continuous within the through-vias 120. As used herein, a "continuous" layer describes a layer that covers 100% of the surface on which it is deposited. So, in some embodiments, the conductive release layer 122 has a thickness that is the minimum thickness sufficient to form a continuous conductive release layer 122 in the through-vias 120. As used herein, continuous refers to deposition of a layer of the same height, thickness, or size across the substrate. However, if the conductive release layer 122 is too thick, portions of the conductive release layer 122 will flake off of the conductive release layer 122, which is not desirable. Accordingly, in some embodiments, the maximum thickness of the conductive release layer 122 is the maximum thickness that does not cause delamination. In some embodiments, the thickness of the conductive release layer is from greater than or equal to 50 nm to less than or equal to 500 nm, such as from greater than or equal to 100 nm to less than or equal to 500 nm, from greater than or equal to 150 nm to less than or equal to 500 nm, from greater than or equal to 200 nm to less than or equal to 500 nm, from greater than or equal to 250 nm to less than or equal to 500 nm, from greater than or equal to 300 nm to less than or equal to 500 nm, from greater than or equal to 350 nm to less than or equal to 500 nm, from greater than or equal to 400 nm to less than or equal to 500 nm, or from greater than or equal to 450 nm to less than or equal to 500 nm. In some embodiments, the thickness of the conductive release layer 122 is from greater than or equal to 50 nm to less than or equal to 450 nm, such as from greater than or equal to 50 nm to less than or equal to 400 nm, from greater than or equal to 50 nm to less than or equal to 350 nm, from greater than or equal to 50 nm to less than or equal to 300 nm, from greater than or equal to 50 nm to less than or equal to 250 nm, from greater than or equal to 50 nm to less than or equal to 150 nm, or from greater than or equal to 50 nm to less than or equal to 100 nm. In some embodiments, the thickness of the conductive release layer 122 is from greater than or equal to 100 nm to less than or equal to 450 nm, such as from greater than or equal to 150 nm to less than or equal to 400 nm, from greater than or equal to 200 nm to less than or equal to 350 nm, or from greater than or equal to 250 nm to less than or equal to 300 nm.

According to embodiments, the conductive release layer may have a porosity from greater than or equal to 1.0 nm to less than or equal to 20.0 nm, such as from greater than or equal to 2.0 nm to less than or equal to 20.0 nm, from greater than or equal to 3.0 nm to less than or equal to 20.0 nm, from greater than or equal to 4.0 nm to less than or equal to 20.0 nm, from greater than or equal to 5.0 nm to less than or equal to 20.0 nm, from greater than or equal to 6.0 nm to less than or equal to 20.0 nm, from greater than or equal to 7.0 nm to less than or equal to 20.0 nm, from greater than or equal to 8.0 nm to less than or equal to 20.0 nm, from greater than or equal to 9.0 nm to less than or equal to 20.0 nm, from greater than or equal to 10.0 nm to less than or equal to 20.0 nm, from greater than or equal to 11.0 nm to less than or equal to 20.0 nm, from greater than or equal to 12.0 nm to less than or equal to 20.0 nm, from greater than or equal to 13.0 nm to less than or equal to 20.0 nm, from greater than or equal to 14.0 nm to less than or equal to 20.0 nm, from greater than or equal to 15.0 nm to less than or equal to 20.0 nm, from greater than or equal to 16.0 nm to less than or equal to 20.0 nm, from greater than or equal to 17.0 nm to less than or equal to 20.0 nm, from greater than or equal to 18.0 nm to less than or equal to 20.0 nm, or from greater than or equal to 19.0 nm to less than or equal to 20.0 nm. In embodiments, the conductive release layer may have a porosity from greater than or equal to 1.0 nm to less than or equal to 19.0 nm, such as from greater than or equal to 1.0 nm to less than or equal to 18.0 nm, from greater than or equal to 1.0 nm to less than or equal to 17.0 nm, from greater than or equal to 1.0 nm to less than or equal to 16.0 nm, from greater than or equal to 1.0 nm to less than or equal to 15.0 nm, from greater than or equal to 1.0 nm to less than or equal to 14.0 nm, from greater than or equal to 1.0 nm to less than or equal to 13.0 nm, from greater than or equal to 1.0 nm to less than or equal to 12.0 nm, from greater than or equal to 1.0 nm to less than or equal to 11.0 nm, from greater than or equal to 1.0 nm to less than or equal to 10.0 nm, from greater than or equal to 1.0 nm to less than or equal to 9.0 nm, from greater than or equal to 1.0 nm to less than or equal to 8.0 nm, from greater than or equal to 1.0 nm to less than or equal to 7.0 nm, from greater than or equal to 1.0 nm to less than or equal to 6.0 nm, from greater than or equal to 1.0 nm to less than or equal to 5.0 nm, from greater than or equal to 1.0 nm to less than or equal to 4.0 nm, from greater than or equal to 1.0 nm to less than or equal to 3.0 nm, or from greater than or equal to 1.0 nm to less than or equal to 2.0 nm. In embodiments, the conductive release layer may have a porosity from greater than or equal to 2.0 nm to less than or equal to 19.0 nm, such as from greater than or equal to 3.0 nm to less than or equal to 18.0 nm, from greater than or equal to 4.0 nm to less than or equal to 17.0 nm, from greater than or equal to 5.0 nm to less than or equal to 16.0 nm, from greater than or equal to 6.0 nm to less than or equal to 15.0 nm, from greater than or equal to 7.0 nm to less than or equal to 14.0 nm, from greater than or equal to 8.0 nm to less than or equal to 13.0 nm, from greater than or equal to 9.0 nm to less than or equal to 12.0 nm, or from greater than or equal to 10.0 nm to less than or equal to 11.0 nm.

The conductive release layer 122 should have a conductivity such that a conductive metal material may be applied to and fill the through-vias 120 by known techniques discussed below, such as, for example, electroplating. If the conductivity of the conductive release layer 122 is too low, the conductive metal material 124 will not fill the through-vias 120. In some embodiments, the conductive release layer 122 has a sheet resistance from greater than or equal to 0.001 ohm/square to less than or equal to 20.000 ohm/square, such as from greater than or equal to 0.010 ohm/square to less than or equal to 20.000 ohm/square, from greater than or equal to 0.100 ohm/square to less than or equal to 20.000 ohm/square, from greater than or equal to 1.000 ohm/square to less than or equal to 20.000 ohm/square, from greater than or equal to 5.000 ohm/square to less than or equal to 20.000 ohm/square, from greater than or equal to 7.500 ohm/square to less than or equal to 20.000 ohm/square, from greater than or equal to 10.000 ohm/square to less than or equal to 20.000 ohm/square, from greater than or equal to 12.500 ohm/square to less than or equal to 20.000 ohm/square, from greater than or equal to 15.000 ohm/square to less than or equal to 20.000 ohm/square, or from greater than or equal to 17.500 ohm/square to less than or equal to 20.000 ohm/square. In some embodiments, the conductive release layer 122 has a sheet resistance from greater than or equal to 0.001 ohm/square to less than or equal to 17.500 ohm/square, such as from greater than or equal to 0.001 ohm/square to less than or equal to 15.000 ohm/square from greater than or equal to 0.001 ohm/square to less than or equal to 12.500 ohm/square, from greater than or equal to 0.001 ohm/square to less than or equal to 10.000 ohm/square, from greater than or equal to 0.001 ohm/square to less than or equal to 7.500 ohm/square, from greater than or equal to 0.001 ohm/square to less than or equal to 5.000 ohm/square, from greater than or equal to 0.001 ohm/square to less than or equal to 1.000 ohm/square, from greater than or equal to 0.001 ohm/square to less than or equal to 0.100 ohm/square, or from greater than or equal to 0.001 ohm/square to less than or equal to 0.010 ohm/square. In some embodiments, the conductive release layer 122 has a sheet resistance from greater than or equal to 0.010 ohm/square to less than or equal to 17.500 ohm/square, such as from greater than or equal to 0.100 ohm/square to less than or equal to 15.000 ohm/square, from greater than or equal to 1.000 ohm/square to less than or equal to 12.500 ohm/square, or from greater than or equal to 5.000 ohm/square to less than or equal to 10.000 ohm/square. The sheet resistance is measured using a four point contact resistance measurement.

In some embodiments, the conductive release layer 122 is applied into the through-vias 120 by immersion, dip coating, or spray coating with an electroless plating solution comprising conductive release material and causing the conductive release material to deposit into the through-vias 120. These electroless plating solutions contain a dissolved metal species to be plated and chemistry to initiate a self reduction process. Once deposited in the through-vias 120, the conductive release material self catalyzes and reacts with the seed layer, thereby bonding with the seed layer. The seed layer and electroless chemistry are chosen such that the seed layer catalyzes oxidation of the reducing agent, causing selective reduction of the dissolved metal species to locations with the seed layer. This self-catalyzing reaction causes the conductive release material to preferably adhere to the seed layer 106 such that the conductive release material is less likely to adhere to other portions of the assembly 112, such as, for example, surfaces of the second substrate 110.

In some embodiments, the conductive release material is selected to be a material that will self-catalyze with the seed layer 106. In some embodiments, the conductive release material is an electroless metal material that is compatible with plating techniques, such as, for example electroless plating. In some embodiments, the conductive release material is selected from electroless copper, electroless nickel, and electroless silver. In some embodiments, the conductive release material is electroless copper.

Figure 1D:
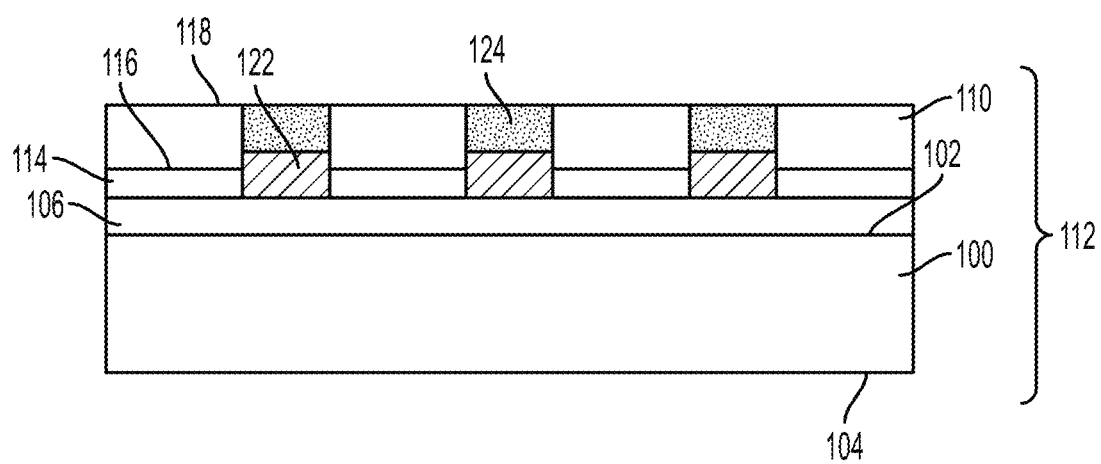

With reference now to FIG. 1D, a conductive metal material 124 can be applied to through-vias 120. In some embodiments, the conductive metal material 124 can be applied to through-vias 120 using known techniques. For example, a typical electrolytic plating process can be used wherein assembly 112 can be placed in a plating bath and electrically charged so that conductive metal material 124 can be deposited in through-vias 120. In some embodiments, through-vias 120 are completely filled with conductive metal material 124, as shown in FIG. 1D. In other embodiments, through-vias 120 are partially filled with conductive metal material 124. In some embodiments, deposition of conductive metal material 124 begins at a "bottom" of through-vias 120 adjacent to conductive release layer 122 and can continue to grow and fill through-vias 120 until the conductive metal material 124 reaches a "top" of through-vias 120. Hence, the process can be referred to as bottom up electrolytic plating. The conductive metal material 124 can be a metal, such as, for example, copper, aluminum, gold, silver, lead, tin, indium tin oxide, or combinations or alloys thereof. It should be understood that in some embodiments, the through-vias 120 is completely filled with the conductive metal material 124. However, in some embodiments, the through-vias 120 may be partially filled with the conductive metal material 124.

Figure 1E:
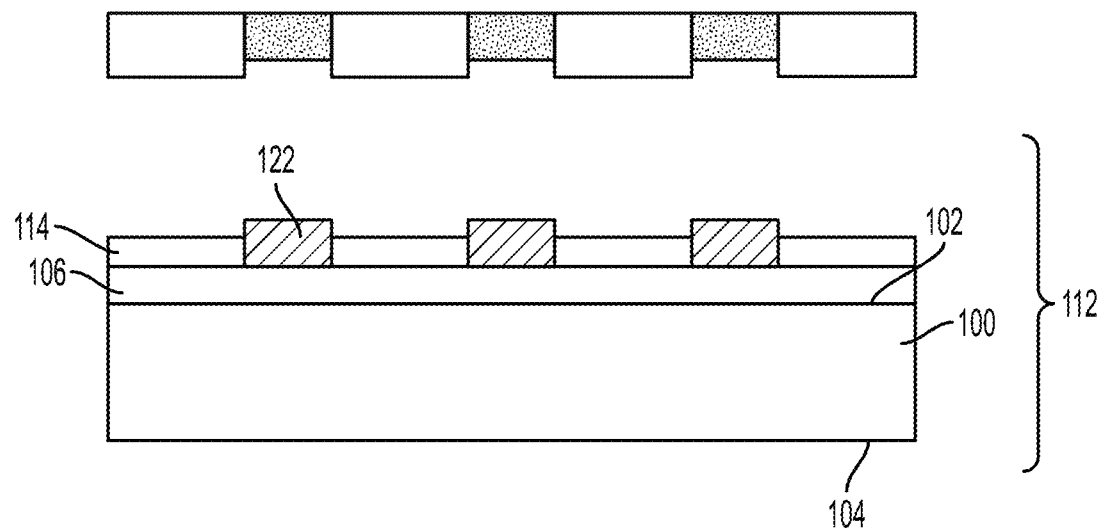

Subsequently, as illustrated in FIG. 1E, the temporary bond between the first substrate 100 and the second substrate 110 can be broken to remove the second substrate 110 from assembly 112 and leave the surface modification layer 114 behind on the first substrate 100. In some embodiments, the temporary bond can be broken with a mechanical force or contact without damage to first substrate 100 or second substrate 110, for example by using a knife edge or blade, suction cup or gripper, air knife, or by simply peeling the second substrate 110 from assembly 112. The first substrate 100 can be cleaned to be re-used again as a carrier substrate. In some embodiments, removing the second substrate 110 is removed from the assembly 112 such that no visibly observable conductive metal material 124 is left on the first substrate 100. As used herein, "visibly observable" means that one with standard vision cannot see any conductive metal material on the first substrate without the use of magnification.

EXAMPLE

Embodiments will be further clarified by the following example.

Example

Figure 2:
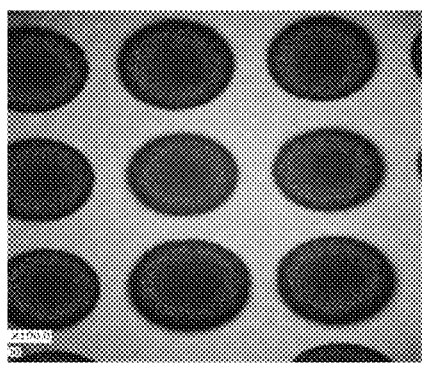
FIG. 2 is a micrograph top view of an interposer formed according to embodiments disclosed and described herein.

An interposer with through-vias having diameters of 25 µm was bonded using a plasma activated carbonaceous plasma polymer film (WIPO Pub. No. WO 2015/112958) to an Eagle XG™ substrate manufactured by Corning Incorporated. The substrate was coated with a layer of 10 nm Ti/100 nm Cu. The bonded interposer was dipped in Transene electroless copper plating solution for 60 seconds at 45° C., which left a thin layer of electroless copper at the bottom of the vias and at the exposed copper on the carrier around the interposer. After rinsing in deionized water, the sample was electroplated in a LPKF MiniContacRS Cu Plating system using LPKF chemistry and a Dynatron DC power supply (0-30 A). The sample was plated for 3 hours at a 500 mA current with oscillation. FIG. 2 shows an optical micrograph (100× magnification) of the de-bonded interposer showing the bottom of the filled copper vias plated by bottom up electroplating using a release layer method. A second sample was partially filled by the same method. No voids or other plating defects were visible in the filled vias.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A method for producing a conductive through-via, comprising:
    applying a seed layer on a surface of a first substrate;
    forming a surface modification layer on at least one of the seed layer and a second substrate, wherein the second substrate comprises a first surface, a second surface, and at least one through-via extending from the first surface to the second surface;
    bonding the second substrate to the first substrate with the surface modification layer formed on at least one of the seed layer and the second substrate to form an assembly, wherein the seed layer and the surface modification layer are disposed between the first substrate and the second substrate;
    forming a conductive release layer in the at least one through-via by placing a conductive release material into the at least one through-via, wherein the conductive release layer is present on the seed layer and in the at least one through-via;
    applying a conductive metal material to the at least one through-via; and
    removing the second substrate from the assembly after applying the conductive metal material to the at least one through via.

2. The method of claim 1, wherein the conductive release layer has an adhesion of less than 1.0 N/cm.

3. The method of claim 1, wherein the conductive release layer is a continuous layer.

4. The method of claim 3, wherein the conductive release layer does not flake.

5. The method of claim 1, wherein the conductive release layer has a thickness from greater than or equal to 50 nm to less than or equal to 500 nm.

6. The method of claim 1, wherein the conductive release layer has a sheet resistance from greater than or equal to 0.001 ohm/square to less than or equal to 20.000 ohm/square.

7. The method of claim 1, wherein the conductive release layer has a porosity from greater than or equal to 1.0 nm to less than or equal to 20.0 nm.

8. The method of claim 1, wherein forming the conductive release layer comprises bonding the conductive release material to the seed layer by self catalyzing the conductive release material.

9. The method of claim 1, wherein the conductive release material is an electroless metal material and forming the conductive release layer comprises electroless plating the conductive release material into the through via and onto the seed layer.

10. The method of claim 9, wherein the conductive release material is selected from the group consisting of electroless nickel, electroless copper, and electroless silver.

11. The method of claim 9, wherein the conductive release material is electroless copper.

12. The method of claim 1, wherein the at least one through-via has a diameter from greater than or equal to 5 µm to less than or equal to 100 µm.

13. The method of claim 1, wherein the seed layer is a conductive metal material selected from the group consisting of copper, silver, tungsten, titanium nitride, titanium tungsten, tantalum nitride, and copper alloys.

14. The method of claim 1, wherein the second substrate is glass or glass ceramic.

15. The method of claim 1, wherein the first substrate is glass or glass ceramic.

16. The method of claim 1, wherein applying the conductive metal material to the at least one through-via comprises electrolytically plating the at least one through-via.

17. The method of claim 1, wherein the at least one through-via is filled with the conductive metal material.

18. The method of claim 1, wherein the conductive metal material is a metal.

19. The method of claim 1, wherein the conductive metal material is copper.

20. The method of claim 1, wherein when the second substrate is removed from the assembly no visually observable amount of the conductive metal remains on the first substrate.

* * * * *